United States Patent
Bai et al.

(10) Patent No.: US 11,837,508 B2
(45) Date of Patent: Dec. 5, 2023

(54) METHOD OF FORMING HIGH-K DIELECTRIC MATERIAL

(71) Applicant: CHANGXIN MEMORY TECHNOLOGIES, INC., Hefei (CN)

(72) Inventors: Jie Bai, Hefei (CN); Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 144 days.

(21) Appl. No.: 17/603,176

(22) PCT Filed: May 25, 2021

(86) PCT No.: PCT/CN2021/095643
§ 371 (c)(1),
(2) Date: Oct. 12, 2021

(87) PCT Pub. No.: WO2021/249179
PCT Pub. Date: Dec. 16, 2021

(65) Prior Publication Data
US 2022/0310458 A1    Sep. 29, 2022

(30) Foreign Application Priority Data
Jun. 12, 2020 (CN) .......................... 202010535476.0

(51) Int. Cl.
*H01L 21/8238* (2006.01)
*H01L 21/28* (2006.01)
(52) U.S. Cl.
CPC ............... *H01L 21/823857* (2013.01); *H01L 21/28185* (2013.01)

(58) Field of Classification Search
CPC ............ H01L 21/823857; H01L 21/28185
(Continued)

(56) References Cited

U.S. PATENT DOCUMENTS

| 7,217,619 B2 | 5/2007 | Knoefler |
| 2007/0152276 A1 | 7/2007 | Arnold |

(Continued)

FOREIGN PATENT DOCUMENTS

| CN | 101814502 A | 8/2010 |
| CN | 102110650 A | 6/2011 |
| CN | 106531785 A | 3/2017 |

OTHER PUBLICATIONS

ISR for International Application PCT/CN2021/095643 dated Aug. 23, 2021.
(Continued)

*Primary Examiner* — Quoc D Hoang
(74) *Attorney, Agent, or Firm* — Ladas & Parry LLP

(57) ABSTRACT

The present application relates to a semiconductor device and a manufacturing method thereof. The method includes: obtaining a substrate, a first device region, a second device region and a high-k gate dielectric layer film being formed on the substrate; forming, on the substrate, a barrier layer structure covering the high-k gate dielectric layer film at the second device region; forming a covering layer film including a first metal element on the substrate; and diffusing the first metal element in the covering layer film towards the high-k gate dielectric layer film at the first device region using an annealing process, the barrier layer structure preventing the first metal element from being diffused towards the high-k gate dielectric layer film at the second device region; wherein the first device region and the second device region have opposite conduction types.

14 Claims, 5 Drawing Sheets

(58) Field of Classification Search
USPC .......................................... 257/591; 438/591
See application file for complete search history.

(56) References Cited

U.S. PATENT DOCUMENTS

| | | | |
|---|---|---|---|
| 2008/0272433 A1* | 11/2008 | Alshareef | H01L 29/66795 |
| | | | 438/157 |
| 2009/0212371 A1 | 8/2009 | Kobayashi | |
| 2010/0279496 A1 | 11/2010 | Kadoshima et al. | |
| 2010/0320542 A1* | 12/2010 | Kawahara | H01L 21/823857 |
| | | | 257/E21.639 |
| 2012/0049288 A1 | 3/2012 | Maruyama et al. | |
| 2016/0064285 A1 | 3/2016 | Moriwaki | |

OTHER PUBLICATIONS

Written Opinion for International Application PCT/CN2021/095643 dated Aug. 23, 2021.

* cited by examiner

METHOD OF FORMING HIGH-K DIELECTRIC MATERIAL

CROSS-REFERENCE TO RELATED APPLICATIONS

This application is a national phase entry of International Patent Application No. PCT/CN2021/095643 filed on May 25, 2021, which claims priority to Chinese Patent Application No. 202010535476.0 filed on Jun. 12, 2020. The entire contents of the aforementioned patent applications are incorporated herein by reference.

TECHNICAL FIELD

The present application relates to the field of semiconductor technologies, in particular to a semiconductor device and a manufacturing method thereof.

BACKGROUND

In a traditional semiconductor industry, a gate dielectric layer of a field effect transistor is made of silicon dioxide. With continuous reduction of a size of a semiconductor device, in order to inhibit a short channel effect to guarantee excellent characteristics of the device, a gate oxide layer (i.e., the gate dielectric layer) is required to be thinner and thinner, at this point, electrons have a serious direct tunneling effect, and meanwhile, the gate dielectric layer has a sharply increased gate electric field, and a resulting leakage current causes the characteristics of the original basic device to be poorer and poorer; that is, with the continuous reduction of the size of the semiconductor device, the silicon-dioxide gate dielectric layer is close to a physical limit thereof; a main leakage current is the direct leakage current caused by the tunneling effect, and a high-k/metal-gate (HKMG, high-dielectric-constant gate dielectric layer+ metal gate) is used in a peripheral transistor of a flash memory device to replace a traditional poly/SiO$_2$ gate stack (silicon-dioxide gate dielectric layer+polycrystalline silicon gate); however, a typical gate-first HKMG transistor has a complicated manufacturing process and a high cost.

SUMMARY

According to various embodiments of the present application, there are provided a semiconductor device and a manufacturing method thereof.

A manufacturing method of a semiconductor device includes:
  obtaining a substrate, a first device region, a second device region and a high-k gate dielectric layer film being formed on the substrate;
  forming a barrier layer structure on the substrate, the barrier layer structure covering the gate dielectric layer film at the second device region;
  forming a covering layer film including a first metal element on the substrate; and
  performing an annealing process, the first metal element being diffused towards the high-k gate dielectric layer film at the first device region, and the barrier layer structure preventing the first metal element from being diffused towards the high-k gate dielectric layer film at the second device region;
  wherein the first device region and the second device region have opposite conduction types.

A semiconductor device is manufactured using the manufacturing method according to any one of the above.

BRIEF DESCRIPTION OF DRAWINGS

To describe the technical solutions in the embodiments of the present application or traditional technologies more clearly, the following briefly describes the accompanying drawings required in the description of the embodiments or the traditional technologies. Apparently, the accompanying drawings in the following description show merely some embodiments of the present application, and a person of ordinary skill in the art may still derive other drawings from these accompanying drawings without creative efforts.

DESCRIPTION OF EMBODIMENTS

Figure 1:
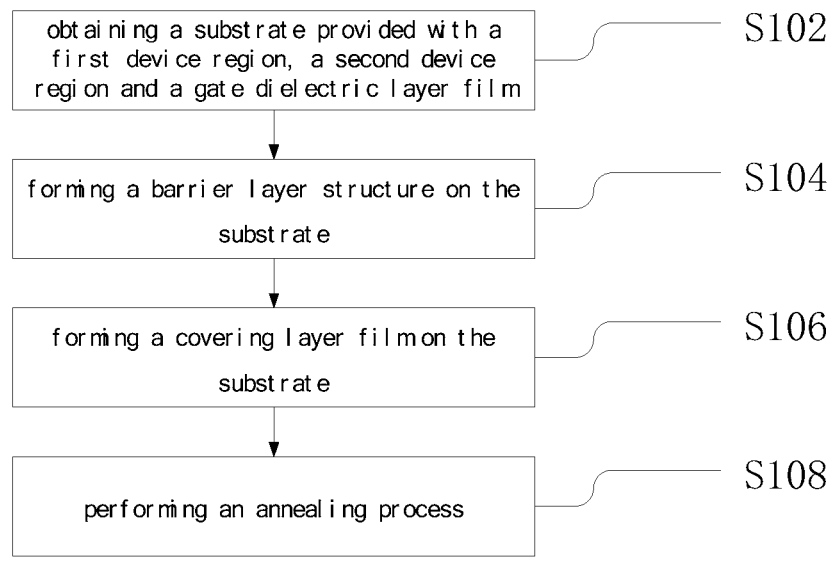
FIG. 1 is a flow chart of a manufacturing method of a semiconductor device according to an embodiment.

For easy understanding of the present application, a more comprehensive description of the present application will be given below with reference to the relevant accompanying drawings. Preferred embodiments of the present application are given in the drawings. However, the present application may be implemented in many different forms and is not limited to the embodiments described herein. Rather, these embodiments are provided to make the contents disclosed in the present application more thorough and comprehensive.

Unless defined otherwise, all technical and scientific terms used herein have the same meanings as are commonly understood by those skilled in the art. The terms used herein in the specification of the present application are for the purpose of describing specific embodiments only but not intended to limit the present application. The term "and/or" used herein includes any and all combinations of one or more related listed items.

It will be understood that when an element or layer is referred to as being "on", "adjacent to", "connected to" or "coupled to" another element or layer, it can be directly on, adjacent to, connected or coupled to the other element or layer or intervening elements or layers may be present. In contrast, when an element is referred to as being "directly on," "directly adjacent to", "directly connected to" or "directly coupled to" another element or layer, there are no intervening elements or layers present. It will be understood that, although the terms first, second, third etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present application. Thus, a first element, component, region, layer, doping type or section discussed below could be termed a second element, component, region, layer or section without departing from the teachings of the present application; for example, a first doping type may be used as a second doping type, and similarly, a second doping type may be used as a first doping type; the first doping type and the second doping type are different; for example, the first doping type may be P-type and the second doping type may be N-type, or the first doping type may be N-type and the second doping type may be P-type.

Spatially relative terms, such as "beneath", "below", "lower", "under", "above", "upper" and the like, may be used herein for ease of description to describe one element or feature's relationship to other elements or features as illustrated in the drawings. It will be understood that the spatially relative terms are intended to encompass different orientations of the device in use or operation in addition to the orientation depicted in the drawings. For example, if the device in the drawings is turned over, elements or features described as "below" or "under" or "beneath" other elements would then be oriented "above" the other elements or features. Thus, the exemplary term "below" and "beneath" may encompass both an orientation of above and below. The device may be otherwise oriented (rotated by 90 degrees or at other orientations) and the spatially relative descriptors used herein are interpreted accordingly.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, determine the presence of stated features, integers, steps, operations, elements, and/or components, but do not preclude the presence or addition of one or more other features, integers, steps, operations, elements, components, and/or groups thereof. The term "and/or" used herein includes any and all combinations of related listed items.

Embodiments of the application are described herein with reference to cross-section illustrations that are schematic illustrations of embodiments (and intermediate structures) of the application. As such, variations from the illustrated shapes as a result, for example, of manufacturing techniques and/or tolerances, are to be expected. Thus, embodiments of the application should not be limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the scope of the application.

A threshold voltage of a MOSFET is mainly determined by a difference between work functions of gate and channel materials, a same bandgap exists between polycrystalline silicon and underlying silicon serving as a channel, and the work function of the polycrystalline silicon may be changed by doping impurities with different polarities; for a transistor with a poly/$SiO_2$ gate stack, the work function of the polycrystalline silicon may be directly adjusted to meet a requirement of reducing a threshold voltage of a PMOS or NMOS. For a HKMG transistor, a metal gate electrode is configured to reduce gate depletion and realize a high performance objective, and a common method of achieving a low threshold voltage is to use a dual-work-function metal gate electrode; that is, in order to simultaneously lower the threshold voltages of the PMOS and the NMOS, gate dielectric layers with different dielectric constants are required to form gates of the PMOS and the NMOS.

A typical gate process for forming different gate dielectric layers of a PMOS and an NMOS includes: step 1: first, successively forming a hafnium silicate (HfSiO) film, an aluminum oxide ($Al_2O_3$) film, a first titanium nitride (TiN) film and a silicon nitride (SiN) film on a surface of a substrate with a silicon dioxide film layer reserved in a device region, wherein the silicon nitride film is used as a hard mask layer; and secondly, forming, on the surface of the substrate, a first photoresist pattern covering the silicon nitride film at the device region in a first conduction type. Step 2: successively removing the silicon nitride film, the first titanium nitride film and the aluminum oxide film exposed from the first photoresist pattern, and then removing the first photoresist pattern on the surface of the substrate. Step 3: successively forming a lanthanum oxide ($La_2O_3$) film and a second titanium nitride (TiN) film on the surface of the substrate, and then forming, on the surface of the substrate, a second photoresist pattern covering the second titanium nitride film at the device region in a second conduction type. Step 4: successively removing the second titanium nitride film, the lanthanum oxide film and the silicon nitride film exposed from the second photoresist pattern, and then removing the second photoresist pattern. The above-mentioned steps result in the silicon dioxide film layer, the hafnium silicate film, the aluminum oxide film and the first titanium nitride film which are located on the surface of the device region in the first conduction type and configured to form a first gate stack corresponding to the device region in the first conduction type, as well as the silicon dioxide film layer, the hafnium silicate film, the lanthanum oxide film and the second titanium nitride film which are located on the surface of the device region in the second conduction type and configured to form a second gate stack at the device region in the second conduction type. The gate dielectric layers corresponding to the gates of the device regions in the first conduction type and the second conduction type are separately formed by at least two different photoetching patterns in the gate process, and therefore, at least two photoetching mask layers are required during formation of gate stack films corresponding to the device regions. In this method, a HKMG gate semiconductor device is formed using more process steps, resulting in a long production cycle and a high production cost.

As shown in FIGS. 1 to 9, an embodiment provides a manufacturing method of a semiconductor device, including:

S102: obtaining a substrate provided with a first device region, a second device region and a gate dielectric layer film;

The substrate 102 is obtained and provided with the first device region 1, the second device region 2 and the gate dielectric layer film 106 (i.e., a high-k gate dielectric layer film) covering the first device region 1 and the second device region 2 on the substrate 102; the high-k gate dielectric layer film is used as the gate dielectric layer film 106, the first device region 1 and the second device region 2 have opposite conduction types, and the high-k gate dielectric layer film has a dielectric constant greater than that of a silicon dioxide film.

In an embodiment, the substrate 102 includes a semiconductor substrate provided with a first device region and a second device region and commonly used in a semiconductor manufacturing industry, including, but is not limited to, Si, Ge, SiGe, SiC, SiGeC, Ga, GaAs, InAs, InP, and other III/V or II/VI compound semiconductor substrates.

In another embodiment, the substrate 102 includes an organic semiconductor substrate or a layered semiconductor substrate provided with a first device region and a second device region, for example, a Si/SiGe substrate, a silicon-on-insulator (SOI) substrate, or a silicon-germanium-on-insulator (SGOI) substrate.

At least one isolation region 105 exists on the substrate 102 and is configured to isolate the adjacent first and second device regions 1, 2 from each other, a trench isolation region or a field oxide isolation region may be used as the isolation region, and the trench isolation region may be formed using a conventional trench isolation process well known to those skilled in the art. For example, the trench isolation region is formed after photoetching and etching operations are performed and a trench is filled with a trench dielectric.

In an embodiment, at least one first device region 1 and one second device region 2 are formed on the substrate 102.

In an embodiment, the gate dielectric layer film 106 includes at least one hafnium-based high-k dielectric layer film having a dielectric constant greater than 10, such as a hafnium oxide film ($HfO_x$), a hafnium silicate film ($HfSiO_x$), a hafnium silicon oxynitride film ($HfSiO_xN_y$), a mixture of a hafnium oxide film and a zirconium oxide film.

In an embodiment, the gate dielectric layer film 106 has a thickness greater than or equal to 0.5 nm and less than or equal to 10 nm, such as 1 nm, 2 nm, 3 nm, 5 nm, 7 nm, 9 nm, or the like.

In an embodiment, the gate dielectric layer film 106 includes at least one high-k gate dielectric layer film having a dielectric constant greater than 4.

In an implementation, the gate dielectric layer film 106 includes at least one high-k gate dielectric layer film having a dielectric constant greater than or equal to 7.

In an embodiment, the gate dielectric layer film 106 includes at least one of a high-k gate metal dielectric layer film, a metal oxide dielectric layer film, and a mixed metal oxide dielectric layer film.

In an embodiment, the gate dielectric layer film 106 includes at least one of a hafnium oxide film, a hafnium silicate film, a hafnium silicon oxynitride film, a zirconium oxide film, an aluminum oxide film, a zirconium silicate film, a zirconium silicon oxynitride film, a hafnium aluminum oxynitride film, a tantalum oxide film, an aluminum oxide film, a lanthanum oxide film, a silicon nitride film, and a silicon oxynitride film.

In an embodiment, the gate dielectric layer film 106 includes at least one of a hafnium element, a zirconium element, a tantalum element, an indium element and an aluminum element.

In an embodiment, the gate dielectric layer film 106 is formed on a surface of the substrate using a deposition process, such as a chemical vapor deposition (CVD) process, a plasma-enhanced chemical vapor deposition (PECVD) process, a physical vapor deposition (PVD) process, a metal-organic chemical vapor deposition (MOCVD) process, an atomic layer deposition (ALD) process, an evaporation process, a reactive sputtering process, a chemical solution deposition process, or other similar deposition processes, or any combination thereof.

S104: forming a barrier layer structure on the substrate.

The barrier layer structure 200 is formed on the substrate 102, exposes the gate dielectric layer film 106 at the first device region 1 and covers the gate dielectric layer film 106 at the second device region 2. By forming the barrier layer structure 200 on the substrate, a first metal element in a covering layer film is prevented from being diffused into the gate dielectric layer film 106 below the second device region 2 in a subsequent annealing process.

Figure 3:
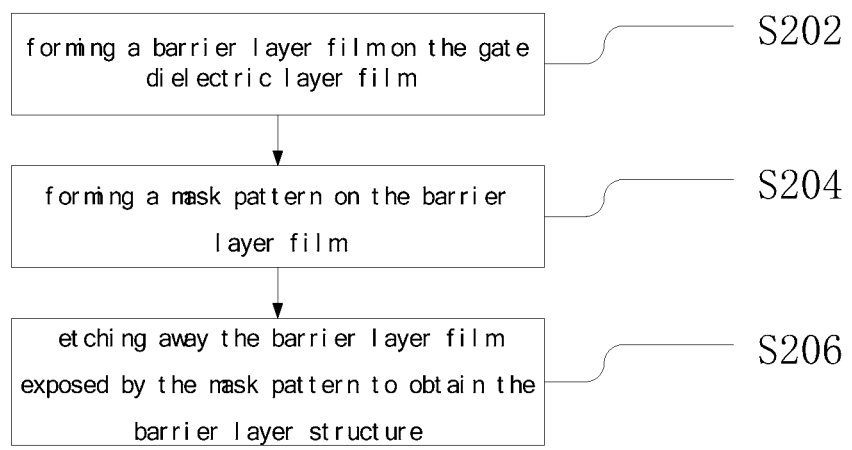
FIG. 3 is a flow chart of formation of a barrier layer structure on a substrate in an implementation.

As shown in FIG. 3, in an embodiment, the step of forming a barrier layer structure 200 on the substrate 102 includes:

S202: forming a barrier layer film on the gate dielectric layer film.

The barrier layer film 202 is formed on the gate dielectric layer film 106 on the substrate 102 using a deposition process.

In an embodiment, the barrier layer film 202 includes at least one film having a diffusion blocking function.

Figure 2:
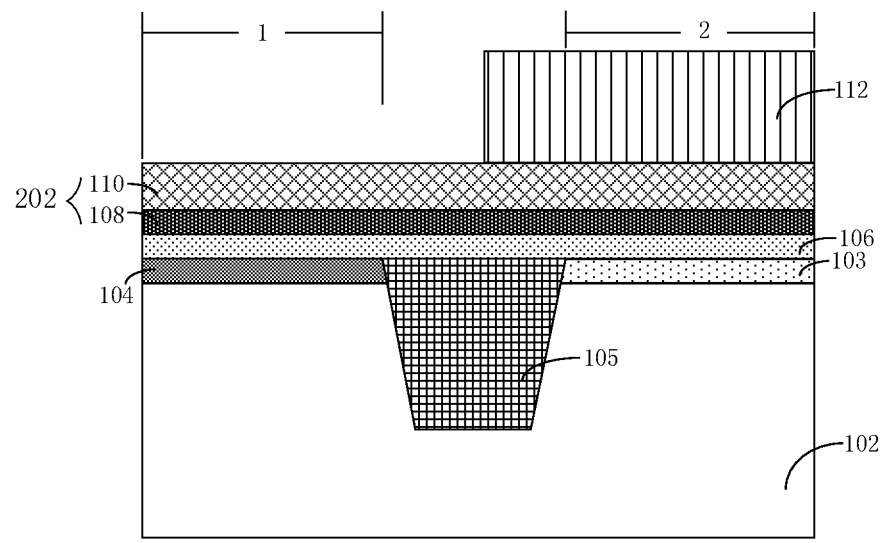
FIG. 2 is a sectional view of a semiconductor device after a mask pattern is formed on a barrier layer film in an implementation.
Figure 4:
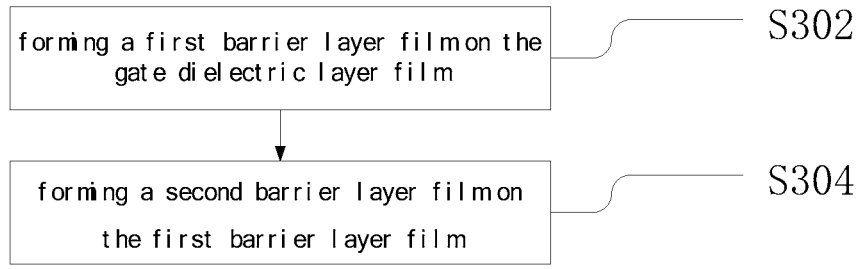
FIG. 4 is a flow chart of formation of the barrier layer film on a gate dielectric layer film according to an embodiment.

As shown in FIGS. 2 and 4, in an embodiment, the barrier layer film 202 includes a first barrier layer film 108 and a second barrier layer film 110, and the step S202 includes:

S302: forming the first barrier layer film on the gate dielectric layer film.

S304: forming the second barrier layer film on the first barrier layer film.

In an embodiment, an aluminum oxide film is used as the first barrier layer film 108, and a titanium nitride film is used as the second barrier layer film 110.

S204: forming a mask pattern on the barrier layer film.

The barrier layer film 202 is coated with photoresist, and then, exposure and development are performed to obtain the mask pattern 112, and the mask pattern 112 exposes the barrier layer film 202 at the first device region 1 and covers the barrier layer film 202 required to be reserved. In an implementation, FIG. 2 shows a sectional view of the semiconductor device after the mask pattern is formed on the barrier layer film.

S206: etching away the barrier layer film exposed by the mask pattern to obtain the barrier layer structure.

Figure 5:
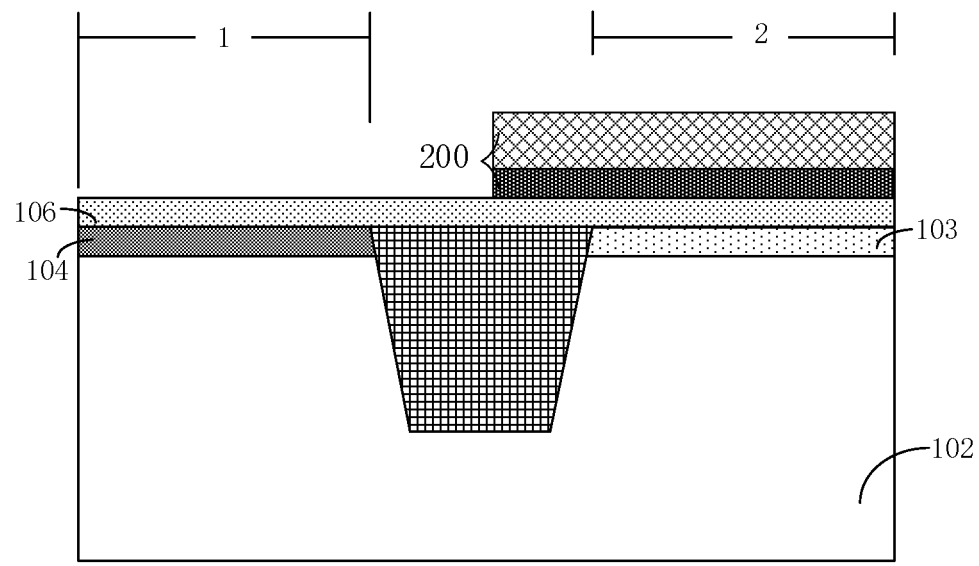
FIG. 5 is a sectional view of the semiconductor device after the barrier layer structure is formed on the substrate in an implementation.

After removal of the barrier layer film 202 at the first device region 1 exposed by the mask pattern 112 using a dry etching or wet etching process, the barrier layer structure 200 formed by the remaining barrier layer film 202 is obtained, and after removal of the mask pattern 112 on the surface of the substrate, the sectional view of the semiconductor device is shown in FIG. 5.

S106: forming the covering layer film on the substrate.

Figure 6:
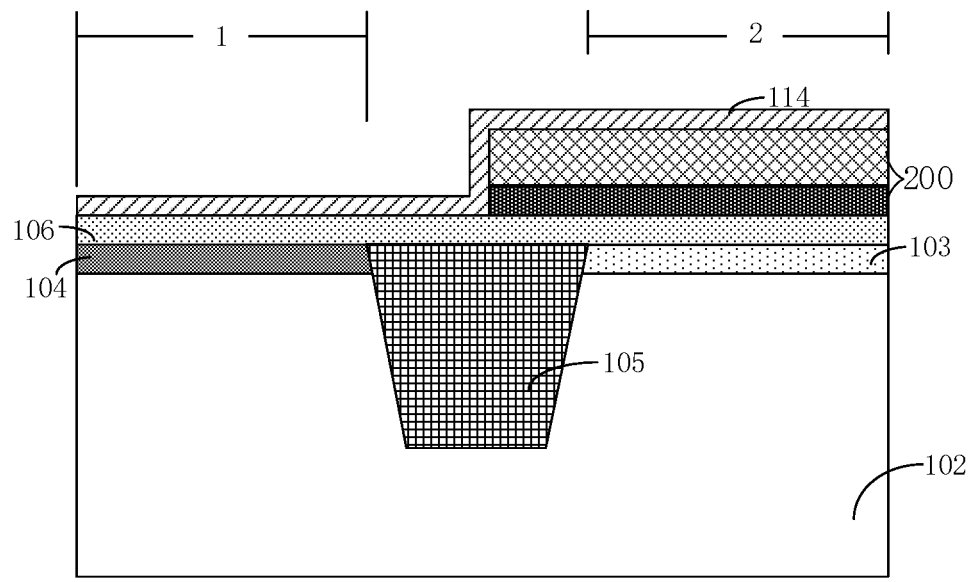
FIG. 6 is a sectional view of the semiconductor device after a covering layer film is formed on the barrier layer structure in an implementation.

The covering layer film 114 is formed on the substrate 102, and the sectional view of the resulting semiconductor device is shown in FIG. 6; the covering layer film 114 includes the first metal element, for example, the covering layer film 114 is formed on the surface of the substrate using an atomic layer deposition process or a physical vapor deposition process.

In an embodiment, the first metal element includes at least one of a lanthanum element, an aluminum element, a magnesium element and a zirconium element.

In an embodiment, the covering layer film 114 includes at least one of a first-metal-element metal film and a first-metal-element metal oxide film, such as a lanthanum film, a lanthanum oxide film, an aluminum film, an aluminum oxide film, or the like.

In an embodiment, the gate dielectric layer film 106 includes a second metal element, the first device region 1 is configured as an N-type device region, and the first metal element has an electronegativity less than that of the second metal element.

In an embodiment, the gate dielectric layer film 106 includes a third metal element, the first device region 1 is configured as a P-type device region, and the first metal element has an electronegativity greater than that of the third metal element.

S108: performing an annealing process.

Figure 7:
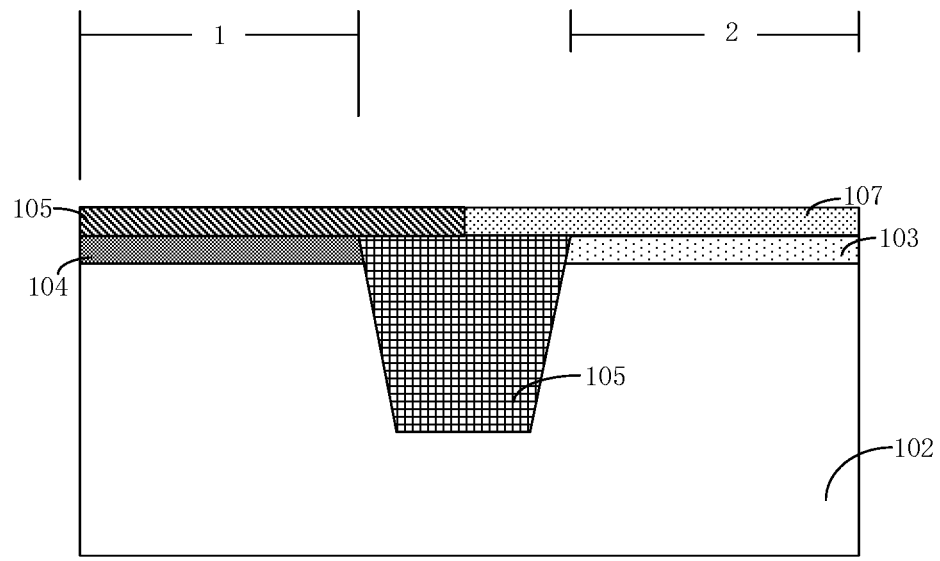
FIG. 7 is a sectional view of the semiconductor device after the covering layer film and the barrier layer structure are removed using an etching process in an implementation.

As shown in FIG. 7, the first metal element in the covering layer film 114 is diffused into the gate dielectric layer film 106 at the first device region 1 using the annealing process, so as to change a dielectric constant of the gate dielectric layer film 106 at the first device region 1, thereby obtaining a first gate dielectric layer 105 at the first device region 1 and a second gate dielectric layer 107 at the second device region 2, the second gate dielectric layer 107 being formed by the gate dielectric layer film 106 located at the second device region 2. The barrier layer structure 200 prevents the first metal element in the covering layer film 114 located on the barrier layer structure 200 from being diffused into the second gate dielectric layer 107, and the first gate dielectric layer 105 and the second gate dielectric layer 107 which have different dielectric constants are obtained using the annealing process.

In an embodiment, an interfacial film layer (IL) is further formed on the substrate 102, and the step of performing an annealing process further includes: diffusing the first metal element to a contact surface between the gate dielectric layer film 106 at the first device region 1 and the interfacial film layer.

In an embodiment, the interfacial film layer is formed using an in-situ stream generation (ISSG) process or a thermal oxidation process.

In an embodiment, the interfacial film layer includes a first interfacial film layer 104 located below the first gate dielectric layer 105 and a second interfacial film layer 103 located below the second gate dielectric layer 107.

Parameters of the annealing process are adjusted to diffuse the first metal element in the covering layer film 114 to the contact surface between the gate dielectric layer film 106 and the first interfacial film layer 104, i.e., the contact surface between the first gate dielectric layer 105 and the first interfacial film layer 104, so as to form a dipole, thereby achieving a purpose of adjusting a work function of the first device region 1 while the first gate dielectric layer 105 with a different dielectric constant is obtained.

In an embodiment, the first interfacial film layer 104 includes at least one of a silicon dioxide ($SiO_x$) film layer and a silicon oxynitride ($SiO_xN_y$) film layer.

In an embodiment, the second interfacial film layer 103 includes at least one of a silicon dioxide ($SiO_x$) film layer and a silicon oxynitride ($SiO_xN_y$) film layer.

In an embodiment, the annealing process is performed in an inert gas atmosphere at a temperature higher than or equal to 500 degrees Celsius and lower than 1300 degrees Celsius. In an actual process, different annealing-process temperatures and annealing-process atmospheres are selected according to actual needs, for example, the annealing process is performed in a nitrogen atmosphere at 1000 degrees Celsius for 30 min.

In an embodiment, the annealing process is performed at a pressure greater than or equal to 1 torr and less than or equal to 760 torr.

In other embodiments, the temperature, time and pressure of the annealing process may be adjusted as required, so as to adjust a depth and a concentration of diffusion of the first metal element into the first gate dielectric layer 105, as well as a quantity of the first metal element diffused to the contact surface between the gate dielectric layer film 106 and the first interfacial film layer 104, thereby achieving the purpose of adjusting the work function of the first device region 1. Within a certain range, the higher the temperature of the annealing process and the longer the annealing time, the more the first metal element is diffused to the gate dielectric layer film 106 and the contact surface between the gate dielectric layer film 106 and the first interfacial film layer 104.

Figure 8:
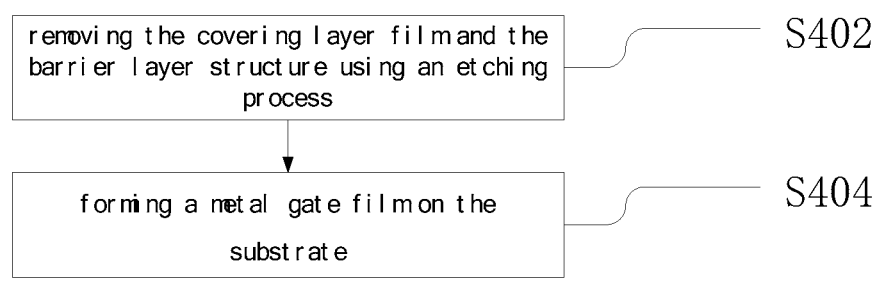
FIG. 8 is a flow chart of a manufacturing method of a semiconductor device after an annealing process according to an embodiment.

As shown in FIG. 8, in an embodiment, after the step S108, the method further includes:

S402: removing the covering layer film and the barrier layer structure using an etching process.

The covering layer film 114 and the barrier layer structure 200 on the substrate 102 are removed using the etching process respectively, and the sectional view of the semiconductor device at this point is shown in FIG. 7.

In an embodiment, the etching process includes at least one of a wet etching process and a dry etching process.

S404: forming a metal gate film on the substrate.

Figure 9:
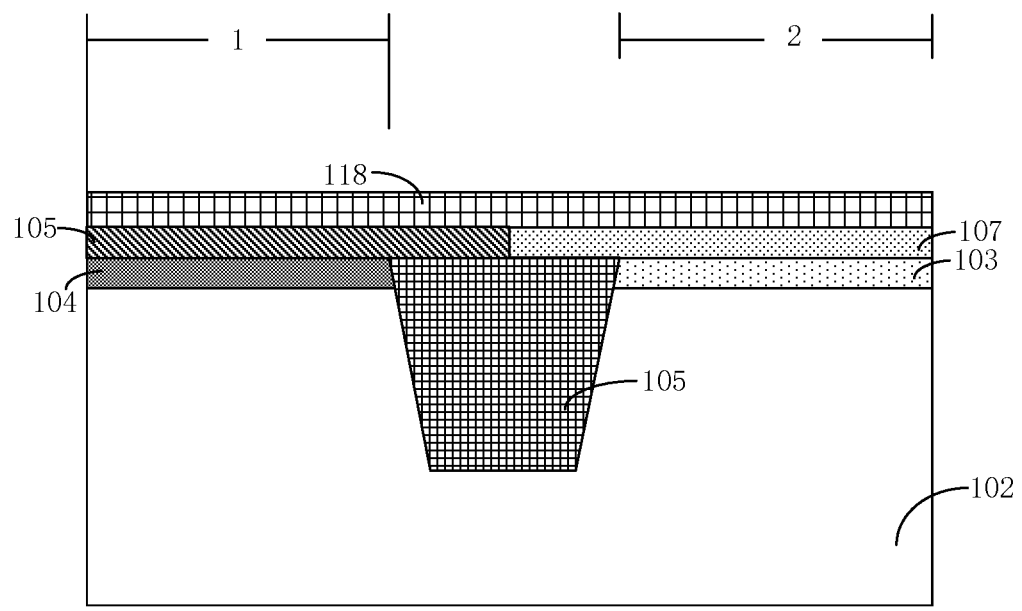
FIG. 9 is a sectional view of a semiconductor device after a metal gate film is formed on a substrate according to an embodiment.

FIG. 9 is a sectional view of the semiconductor device after the metal gate film 118 is formed on the substrate 102 according to an embodiment. The first device region 1 is provided with a first gate stack film formed by the first interfacial film layer 104, the first gate dielectric layer 105, and the metal gate film 118 and configured to form a gate of the first device region 1, and the second device region 2 is provided with a second gate stack film formed by the second interfacial film layer 103, the second gate dielectric layer 107, and the metal gate film 118 and configured to form a gate of the second device region 2.

In an embodiment, the method further includes the step of forming the gates of the first device region 1 and the second device region 2 using a pattern transfer process.

In an embodiment, the metal gate film 118 includes at least one of a titanium nitride film, a tungsten film and a molybdenum film.

In an embodiment, the metal gate film 118 is formed on the substrate using a CVD, PVD, ALD, sputtering or evaporation process.

In an embodiment, the metal gate film 118 has a thickness greater than or equal to 0.5 nm and less than or equal to 200 nm, such as 5 nm, 15 nm, 50 nm, 80 nm, 150 nm, 200 nm, or the like.

In an embodiment, the metal gate film 118 includes a mid-bandgap work function material film.

The above-mentioned manufacturing method of a semiconductor device includes: obtaining the substrate, the first device region, the second device region and the high-k gate dielectric layer film being formed on the substrate; forming the barrier layer structure on the substrate, the barrier layer structure covering the high-k gate dielectric layer film at the second device region; forming the covering layer film including the first metal element on the substrate; and performing the annealing process, the first metal element being diffused towards the high-k gate dielectric layer film at the first device region, and the barrier layer structure preventing the first metal element from being diffused towards the high-k gate dielectric layer film at the second device region; wherein the first device region and the second device region have opposite conduction types. In the present application, the barrier layer structure covering the high-k gate dielectric layer film at the second device region and the covering layer film including the first metal element are formed on the substrate, and then, the first metal element is diffused towards the high-k gate dielectric layer film using the annealing process, such that the high-k gate dielectric layers at the first device region and the second device region have different dielectric constants. Compared with a traditional gate-first HKMG process in which two or more photoetching mask layers are configured to form a gate film layer at a first device region and a gate film layer at a second device region respectively, in the present application, there exist fewer process steps for making the high-k gate dielectric layers at the first device region and the second device region have different dielectric constants, thus shortening a production period of the semiconductor device, and reducing a production cost.

An embodiment provides a semiconductor device manufactured using the manufacturing method according to any one of the above.

In an embodiment, the semiconductor device at least includes a first device region and a second device region.

In an embodiment, the semiconductor device includes a flash memory device, a logic device, a complementary metal oxide semiconductor device and a field effect transistor device.

The above-mentioned semiconductor device is manufactured using the manufacturing method according to any one of the above. Compared with the traditional gate-first HKMG process in which two or more photoetching mask layers are configured to form the gate film layer at the first device region and the gate film layer at the second device region respectively, in the present application, there exist fewer process steps for making the high-k gate dielectric layers at the first device region and the second device region have different dielectric constants, thus shortening the production period of the semiconductor device, and reducing the production cost.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present application, and their description is specific and detailed, but cannot therefore be understood as a limitation on the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A manufacturing method of a semiconductor device, comprising:
    obtaining a substrate, a first device region, a second device region and a high-k gate dielectric layer film being formed on the substrate;
    forming a barrier layer structure on the substrate, the barrier layer structure covering the high-k gate dielectric layer film at the second device region;
    forming a covering layer film comprising a first metal element on the substrate; and
    performing an annealing process, the first metal element being diffused towards the high-k gate dielectric layer film at the first device region, and the barrier layer structure preventing the first metal element from being diffused towards the high-k gate dielectric layer film at the second device region;
    wherein the first device region and the second device region have opposite conduction types;
    wherein an interfacial film layer is further formed on the substrate, and the step of performing an annealing process further comprises:
    diffusing the first metal element to a contact surface between the high-k gate dielectric layer film at the first device region and the interfacial film layer.

2. The method according to claim 1, wherein the high-k gate dielectric layer film comprises a second metal element, the first device region is configured as an N-type device region, and the first metal element has an electronegativity less than that of the second metal element.

3. The method according to claim 1, wherein the high-k gate dielectric layer film comprises a third metal element, the first device region is configured as a P-type device region, and the first metal element has an electronegativity greater than that of the third metal element.

4. The method according to claim 1, wherein the annealing process is performed in an inert gas atmosphere at a temperature higher than or equal to 500 degrees Celsius and lower than or equal to 1300 degrees Celsius.

5. The method according to claim 1, wherein the high-k gate dielectric layer film comprises at least one of a metal film and a metal oxide film, and the covering layer film comprises at least one of a first-metal-element metal film and a first-metal-element metal oxide film.

6. The method according to claim 1, wherein the annealing process is performed at a pressure greater than or equal to 1 torr and less than or equal to 760 torr.

7. The method according to claim 1, after the annealing process, further comprising the following steps:
    removing the covering layer film and the barrier layer structure using an etching process; and
    forming a metal gate film on the substrate.

8. The method according to claim 7, wherein the etching process comprises at least one of a wet etching process and a dry etching process.

9. The method according to claim 1, wherein the step of forming a barrier layer structure on the substrate comprises:
    forming a barrier layer film on the high-k gate dielectric layer film;
    forming a mask pattern on the barrier layer film, the mask pattern exposing the barrier layer film at the first device region; and
    etching away the barrier layer film exposed by the mask pattern to obtain the barrier layer structure.

10. The method according to claim 9, wherein the barrier layer film comprises a first barrier layer film and a second barrier layer film, and the step of forming a barrier layer film on the high-k gate dielectric layer film comprises:

forming the first barrier layer film on the high-k gate dielectric layer film; and forming the second barrier layer film on the first barrier layer film.

11. The method according to claim 10, wherein an aluminum oxide film is used as the first barrier layer film, and a titanium nitride film is used as the second barrier layer film.

12. The method according to claim 1, wherein the high-k gate dielectric layer film comprises at least one of a hafnium element, a zirconium element, a tantalum element, an indium element and an aluminum element.

13. The method according to claim 1, wherein the high-k gate dielectric layer film comprises at least one of a hafnium oxide film, a hafnium silicate film, a hafnium silicon oxynitride film, a zirconium oxide film, an aluminum oxide film, a zirconium silicate film, a zirconium silicon oxynitride film, a hafnium aluminum oxynitride film, a tantalum oxide film, an aluminum oxide film, a lanthanum oxide film, a silicon nitride film, and a silicon oxynitride film, and the first metal element comprises at least one of a lanthanum element, an aluminum element, a magnesium element, and a zirconium element.

14. A semiconductor device manufactured using the manufacturing method according to claim 1.

* * * * *